United States Patent
Liu et al.

(10) Patent No.: US 7,319,597 B2
(45) Date of Patent: Jan. 15, 2008

(54) SUBRACK FOR RECEIVING PLUG-IN UNITS WITH CODE PINS

(75) Inventors: Yong Liu, Shenzhen (CN); ShouLun Wang, Shenzhen (CN); Chuancheng Hou, Shenzhen (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 285 days.

(21) Appl. No.: 10/900,483

(22) Filed: Jul. 27, 2004

(65) Prior Publication Data

US 2005/0128718 A1    Jun. 16, 2005

(30) Foreign Application Priority Data

Dec. 16, 2003   (CN) .................. 2003 2 0119783 U (51) Int. Cl.
*H05K 5/00*    (2006.01)
(52) U.S. Cl. ................. 361/752; 361/756; 361/759
(58) Field of Classification Search ............... 361/724, 361/728, 740, 741, 752, 756, 759, 796, 801, 361/802, 727, 800
See application file for complete search history.

(56) References Cited

U.S. PATENT DOCUMENTS

| 3,723,823 | A | * | 3/1973 | Lit et al. | 361/802 |
| 5,019,947 | A |  | 5/1991 | Pelzl |  |
| 5,892,662 | A | * | 4/1999 | Verma | 361/796 |
| 5,959,843 | A | * | 9/1999 | Kurrer et al. | 361/754 |
| 6,560,120 | B2 | * | 5/2003 | Kurrer et al. | 361/759 |
| 7,006,358 | B2 | * | 2/2006 | Liu et al. | 361/752 |

* cited by examiner

*Primary Examiner*—Tuan T. Dinh
*Assistant Examiner*—Abiy Getachew
(74) *Attorney, Agent, or Firm*—Wei Te Chung (57) ABSTRACT

A subrack (1) includes a plurality of plug-in units (50), two parallel sidewalls (10, 20), a bottom wall (24), and a top wall (30). Each of the plug-in units includes a particular combination of code pins (60). Each of the bottom wall and top wall includes a first plate (35). The first plate defines a plurality of spaced slide channels (351) for slidably receiving the plug-in units respectively, and forms a plurality of L-shaped flakes (40) substantially in front of the slide channels respectively. Any one or more of a height, a length, and a deviation relative to the corresponding slide channel of each of the flakes varies relative to another one of the flakes according to different combinations of corresponding code pins, in order that the flakes respectively match the combinations of the corresponding code pins and thereby prevent improper insertion of the plug-in units into the subrack.

12 Claims, 6 Drawing Sheets

SUBRACK FOR RECEIVING PLUG-IN UNITS WITH CODE PINS

BACKGROUND OF THE INVENTION

1. Field of the Invention

The present invention relates to component mounting apparatuses, and particularly to a subrack and corresponding plug-in units having code pins with simplified configurations for conveniently mounting the plug-in units into the subrack.

2. Description of the Related Art

Subracks for receiving plug-in units therein have been known in the electronics industry for a long time. A typical subrack comprises two sidewalls each having four corners, and four module rails fixed between the sidewalls, the module rails conventionally being screwed to the corresponding corners of the sidewalls. Bottom, top and back walls are attached to the subrack, and cooperate with the sidewalls to define a receiving space therebetween and an open side. The plug-in units can be inserted into and removed from the receiving space via the open side. The plug-in units typically comprise mounting panels engaging with two front module rails to thereby hold the plug-in units in place. For a thorough understanding of this kind of subrack, refer to the IEEE (International Electrical and Electronics Engineers) Standard 1101.10 established in 1996.

Various coding devices are used in subracks to enable plug-in units be correctly mounted to corresponding slide channels. Typically, combinations of code pins are used in the plug-in units. U.S. Pat. No. 5,019,947 discloses a coding device for plug-in units in subracks. The coding device comprises a subrack, a circuit board 6, and plug connection connectors 5. The subrack employs a plurality of coding elements 3 and a plurality of guide rails 2. The coding elements 3 each define two slots 4 therein. The plug connection connectors 5 respectively form two webs 7, 8 corresponding to the slots 4 of the coding elements 3. The webs 7, 8 corresponding to the coding elements 3 ensure that coding occurs as soon as the individual coding elements 3 are engaged on the subrack. However, this configuration complicates the manufacturing process of the subrack. In addition, for production of these rather elaborate components, complicated tools are required, and manufacturing of the additional coding elements 3 is quite expensive.

Thus, a new subrack for plug-in units with code pins which overcomes the above-mentioned problems is desired.

SUMMARY OF THE INVENTION

Accordingly, an object of the present invention is to provide a subrack for a plurality of plug-in units, the subrack having a plurality of code pins with simplified configurations.

Another object of the present invention is to provide a subrack that is easily assembled and that has a plurality of code pins with simplified configurations for convenient use.

To achieve the above-mentioned objects, a subrack in accordance with a preferred embodiment of the present invention comprises a plurality of plug-in units, a pair of parallel sidewalls, a bottom wall, and a top wall. Each plug-in unit employs a particular combination of code pins. Each of the bottom wall and top walls includes a first plate, and a second plate engaged with the first plate. The first plate defines a plurality of spaced slide channels for slidably receiving the plug-in units therein respectively, and forms a plurality of L-shaped flakes in front of each slide channel. Each L-shaped flake is configured to correspond to a combination of code pins of a respective one of the plug-in units. The height, length and deviation relative to the corresponding slide channel of each of the flakes varies among the flakes according to different combinations of code pins on the respective mounting panels. That is, the varying flakes respectively match the varying combinations of code pins and enable the plug-in units to be correctly inserted into the subrack. That is, the plug-in units are prevented from being improperly inserted.

Other objects, advantages and novel features of the present invention will be drawn from the following detailed description of the preferred embodiment of the present invention with the attached drawings, in which:

DETAILED DESCRIPTION OF THE INVENTION

Figure 1:
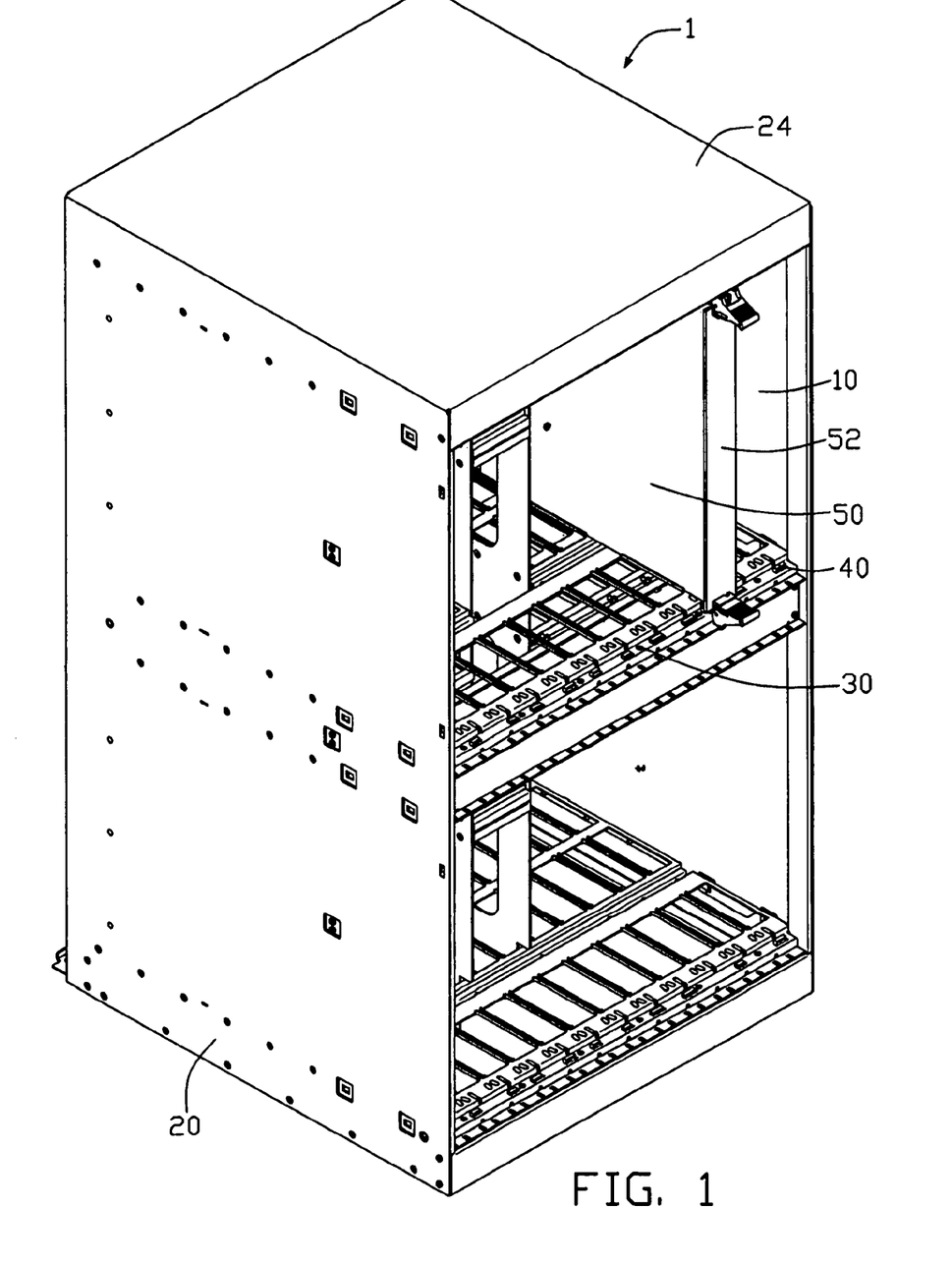
FIG. 1 is an isometric assembled view of a subrack in accordance with the preferred embodiment of the present invention, together with a plug-in unit received therein.
Figure 2:
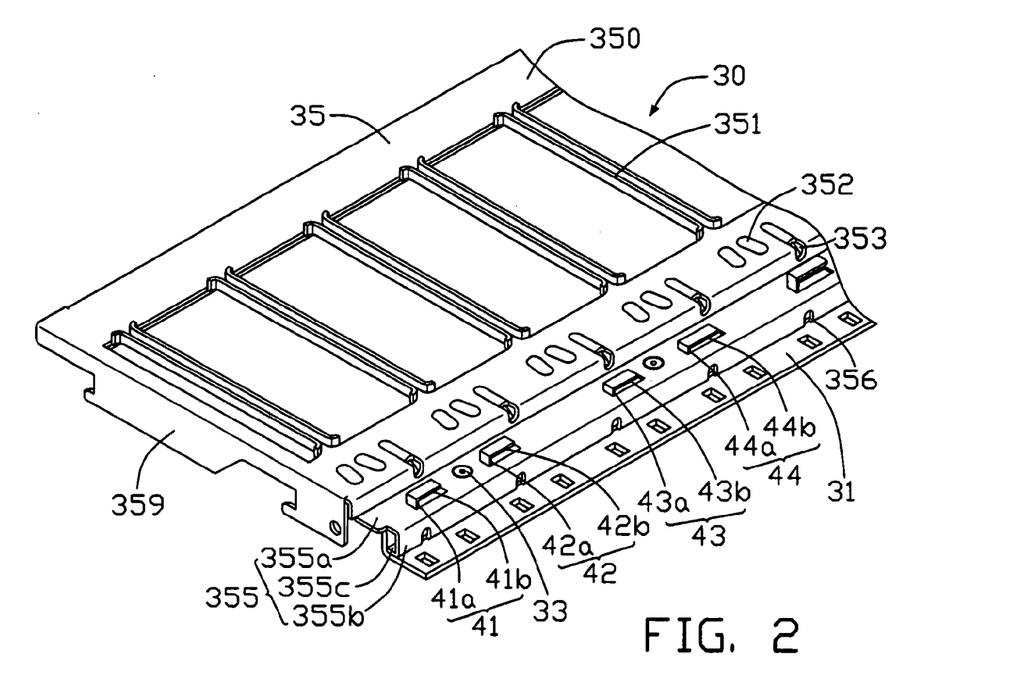
FIG. 2 is an enlarged, isometric view of a part of a bottom wall of the subrack of FIG. 1, the bottom wall including a plurality of flakes.
Figure 3:
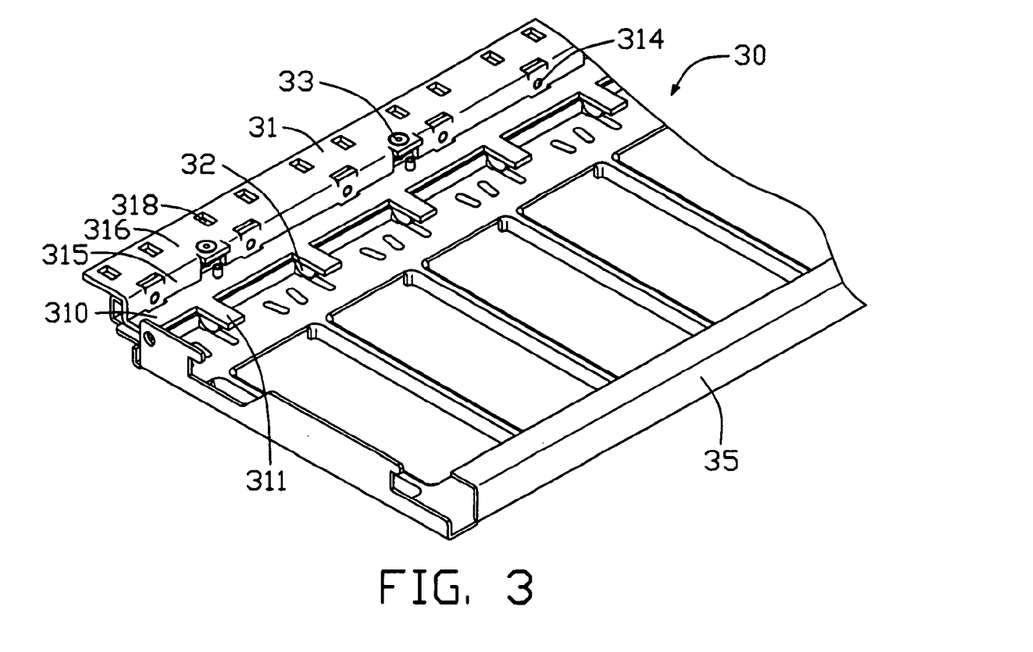
FIG. 3 is similar to FIG. 2, but showing the bottom wall inverted.

Referring to FIG. 1 to FIG. 3, a subrack 1 with code pins of the present invention is used for receiving a plurality of spaced plug-in units 50 therein. For the sake of simplicity, unless the context indicates otherwise, only one plug-in unit 50 is shown and described hereafter. The subrack 1 of the preferred embodiment has two levels for plug-in units 50. It should be appreciated that the subrack 1 may alternatively be configured to have only one level, or three or more levels. For the sake of describing the preferred embodiment simply, only the upper of the two levels is described hereafter. The subrack 1 comprises two parallel sidewalls 10, and opposite top and bottom walls 24, 30 fixed between the sidewalls 10. The sidewalls 10 and top and bottom walls 24, 30 cooperatively define a space therebetween for receiving the plug-in units 50.

Figure 4:
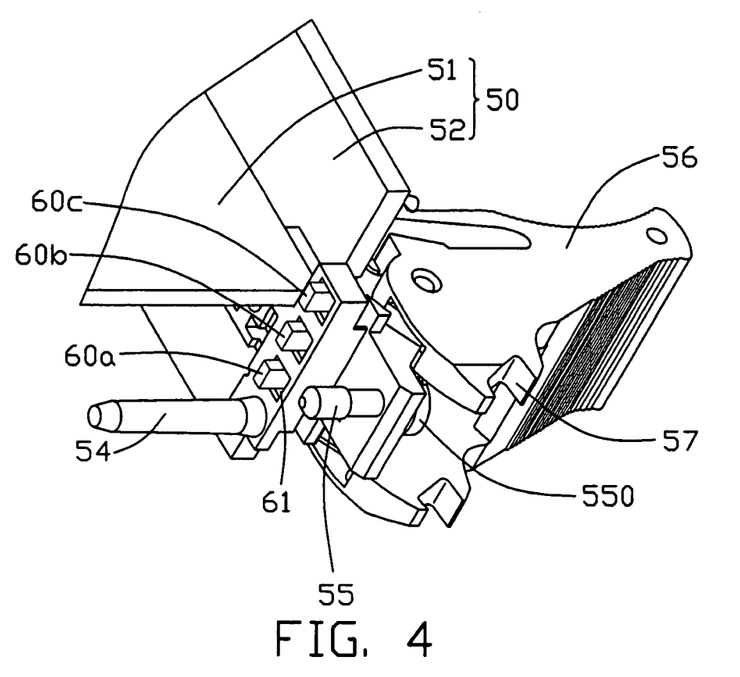
FIG. 4 is an enlarged, isometric view showing a first possible combination of code pins of the plug-in unit of FIG. 1.

Referring also to FIG. 4, the plug-in unit 50 comprises a printed circuit board (PCB) 51, and a mounting panel 52 attached to a front end of the PCB 51. A pair of handles 56 is attached to top and bottom ends of the mounting panel 52 respectively. Each handle 56 is known in the art as an "injector/extractor handle", and is used for inserting or extracting the plug-in unit 50 into or from the subrack 1. The handle 56 at a top end of the mounting panel 52 comprises a pair of upwardly-extending claws 57 at a top side thereof. The handle 56 at a bottom end of the mounting panel 52 comprises a pair of downwardly-extending claws 57 at a bottom side thereof. For the sake of simplicity, only the latter of the handles 56 is described hereafter. An alignment pin 54 extends inwardly from an inside of each end of the mounting panel 52. A mounting pin 55 is movably retained in a hole of the mounting panel 52 adjacent each alignment pin 54; and in the exemplary embodiment, the mounting pin 55 is a screw. A screw head 550 is located at an outside of the mounting panel 52. Prior to attachment of the plug-in unit 50 in the subrack 1, the screw 55 can be freely moved forward and rearward in the hole. The mounting panel 52 defines three square openings 61 at the bottom side therein, and a side length of each opening 61 is denoted "a" (see FIG. 9A). In each opening 61, a plug-in code pin 60 is retained. The length of each code pin 60 is the same as that of each opening 61, and is also denoted "a" (see FIG. 9A). The width of each code pin 60 is denoted "a/2". There are four possible permutations of each code pin 60 in each opening 61; that is, upright-left, upright-right, transverse-up, and transverse-down. Thus, there are 64 possible permutations of a group of three code pins 60 (i.e., 4*4*4).

The top and bottom walls 24, 30 are made from corrosion-protected sheet steel, and are identical in the preferred embodiment. For the sake of simplicity, FIGS. 2 and 3 illustrate only the bottom wall 30. The bottom wall 30 comprises first and second plates 35, 31, which have a same thickness and are attached together by fastening devices such as rivets 33. Alternatively, other fastening means such as soldering can be used for connecting the first and second plates 35, 31 together. To prevent accumulation of static electricity, a plurality of conductive gaskets 32 is attached between the first and second plates 35, 31.

The first plate 35 comprises a main portion 350, and a recessed edge portion 355. A plurality of parallel, evenly spaced slide channels 351 is defined in the main portion 350, for slidingly receiving respective PCBs 51 therein. Preferably, the slide channels 351 are formed by a stamping process. A pair of spaced, divergent protrusions 352 is formed on the main portion 350 in front of each slide channel 351. The protrusions 352 cooperatively form a V-shaped entrance for guiding a corresponding PCB 51 into the slide channel 351. An alignment hole 353 is defined in the main portion 350 adjacent each pair of protrusions 352, corresponding to the alignment pin 54 of a respective plug-in unit 50. A pair of side flanges 359 depends from opposite ends of the main portion 350 respectively. The side flanges 359 each define a screw hole (not labeled) and a hooking structure (not labeled), for connection of the first plate 35 to the sidewalls 10. Alternatively, other suitable joining means may instead be provided on the side flanges 359 for connection of the first plate 35 to the sidewalls 10.

The recessed edge portion 355 sequentially comprises first, second and third bent plates 355a, 355b, 355c integrally joined together at respective perpendicularly bent junctions therebetween. A row of spaced through apertures 356 is defined in the second bent plate 355b. A plurality of L-shaped flakes 40 are functioning as constraint devices is formed along the first plate 355a corresponding to the plurality of slide channels 351 respectively. The exact position and configuration of each L-shaped flake 40 corresponds to the combination of three code pins 60 on the particular mounting panel 52 that is to be mounted at that location of the first plate 355a. Preferably, the flakes 40 are formed by a stamping process. Every two adjacent flakes 40 are differential in height, width, and deviation relative to the corresponding slide channel 351, varying with different mounting panels 52 having different combinations of code pins 60.

Referring to FIG. 4 through FIG. 9D, in order to reduce manufacturing processes of the subrack 1 while still providing coding for a certain number of plug-in units 50, the flakes 40 of the first plate 355a of the subrack 1 have simplified configurations. For the sake of simplicity, only the flakes 41, 42, 43, 44 are illustrated and described hereafter. The flake 41 comprises a vertical portion 41a and a horizontal portion 41b. The height of the flake 41 is denoted d1, the length is denoted e1, and the deviation relative to the slide channel 351 is denoted c1. The flake 42 comprises a vertical portion 42a and a horizontal portion 42b. The height of the flake 42 is denoted d2, the length is denoted e2, and the deviation relative to the slide channel 351 is denoted c2. The flake 43 comprises a vertical potion 43a and a horizontal portion 43b. The height of the flake 43 is denoted d3, the length is denoted e3, and the deviation relative to the slide channel 351 is denoted c3. The flake 44 comprises a vertical portion 44a and a horizontal potion 44b. The height of the flake 44 is denoted d4, the length is denoted e4, and the deviation relative to the slide channel 351 is denoted c4.

Figure 9A:
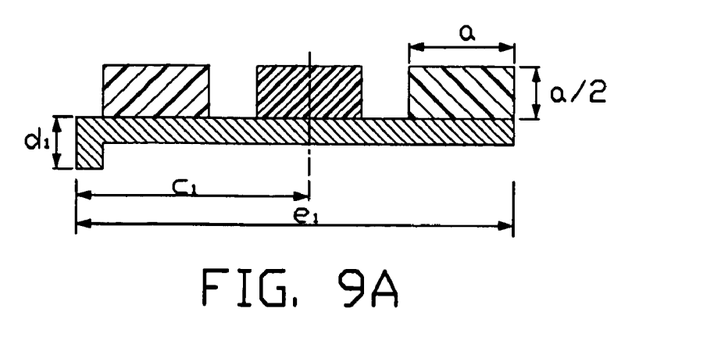
FIG. 9A is a schematic view of a first flake of the bottom wall engaging with a corresponding combination of code pins.

Referring to FIG. 4 through FIG. 7 and FIG. 9A through FIG. 9D, four flakes 40 and their corresponding code pins 60 are schematically illustrated. In FIG. 4 and FIG. 9A, a code pin combination 60a, 60b, 60c is shown, wherein each code pin 60a or 60b or 60c is engaged in a transverse-up position. The corresponding flake 41 is configured as follows: the height d1 is less than a/2, the length e1 is greater than 3a, and the deviation c1 relative to the slide channel 351 is greater than 3a/2, in order to ensure that the combination of code pins 60a, 60b, 60c can avoid being blocked by the flake 41 and enable the plug-in unit 50 to be inserted into the subrack 1.

Figure 5:
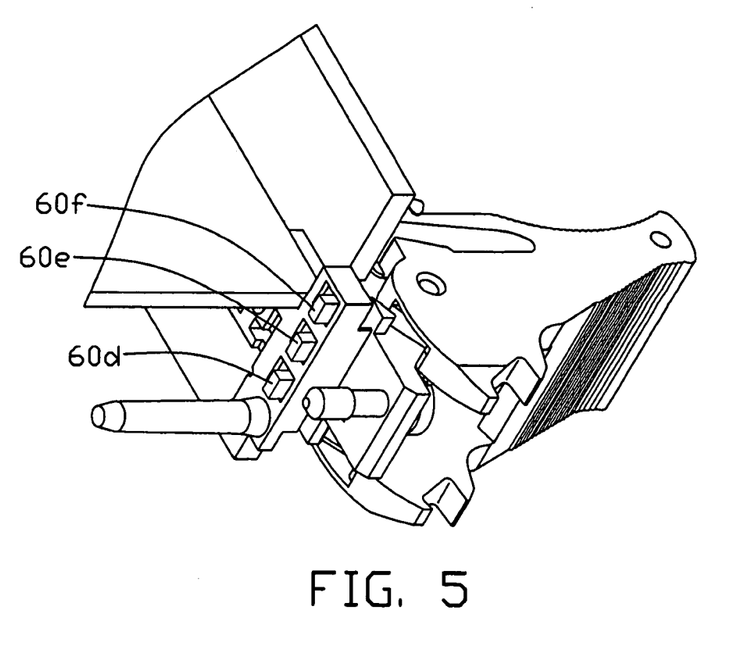
FIG. 5 is an enlarged, isometric view showing a second possible combination of code pins of the plug-in unit of FIG. 1.
Figure 9B:
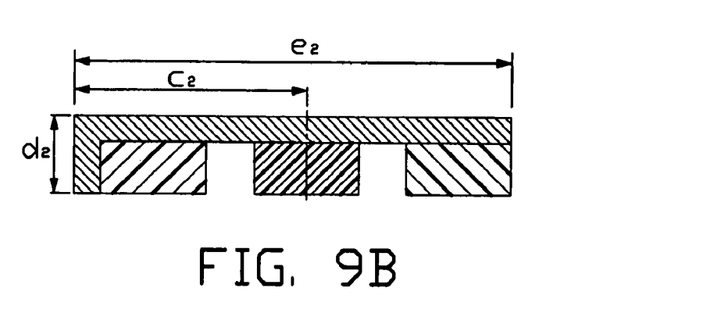
FIG. 9B is a schematic view of a second flake of the bottom wall engaging with a corresponding combination of code pins.

In FIG. 5 and FIG. 9B, a code pin combination 60d, 60e, 60f is shown, wherein each code pin 60d or 60e or 60f is engaged in a transverse-down position. The corresponding flake 42 is configured as follows: the height d2 is greater than a/2, the length e2 is greater than 3a, and the deviation c2 relative to the slide channel 351 is greater than 3a/2, in order to ensure that the combination of code pins 60d, 60e, 60f can avoid being blocked by the flake 42 and enable the plug-in unit 50 to be inserted into the subrack 1.

Figure 6:
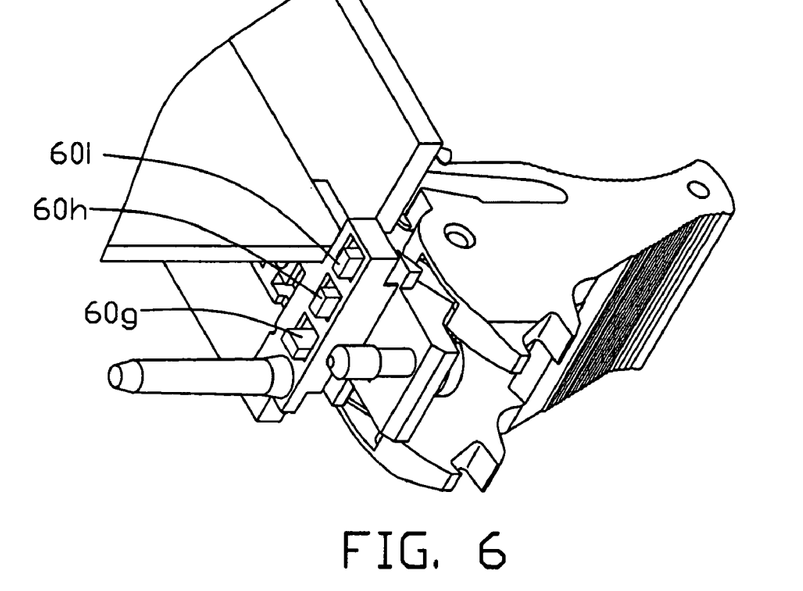
FIG. 6 is an enlarged, isometric view showing a third possible combination of code pins of the plug-in unit of FIG. 1.
Figure 9C:
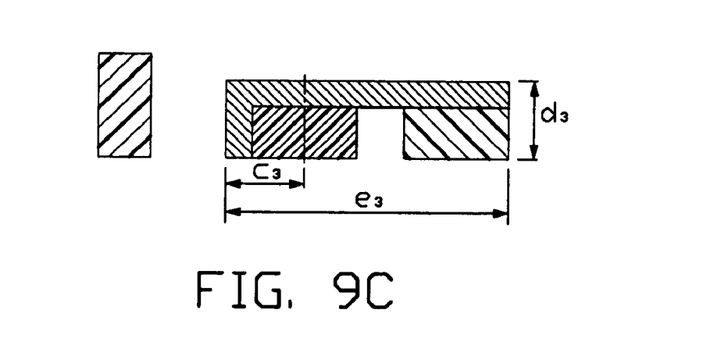
FIG. 9C is a schematic view of a third flake of the bottom wall engaging with a corresponding combination of code pins.

In FIG. 6 and FIG. 9C, a code pin combination 60g, 60h, 60i is shown, wherein the code pin 60g is engaged in an upright-left position and each code pin 60h or 60i is engaged in a transverse-down position. The corresponding flake 43 is configured as follows: the height d3 is greater than a/2, the length e3 is greater than 2a and less than 5a/2, and the deviation c3 relative to the slide channel 351 is greater than a/2 and less than a, in order to ensure that the combination of code pins 60g, 60h, 60i can avoid being blocked by the flake 43 and enable the plug-in unit 50 to be inserted into the subrack 1.

Figure 7:
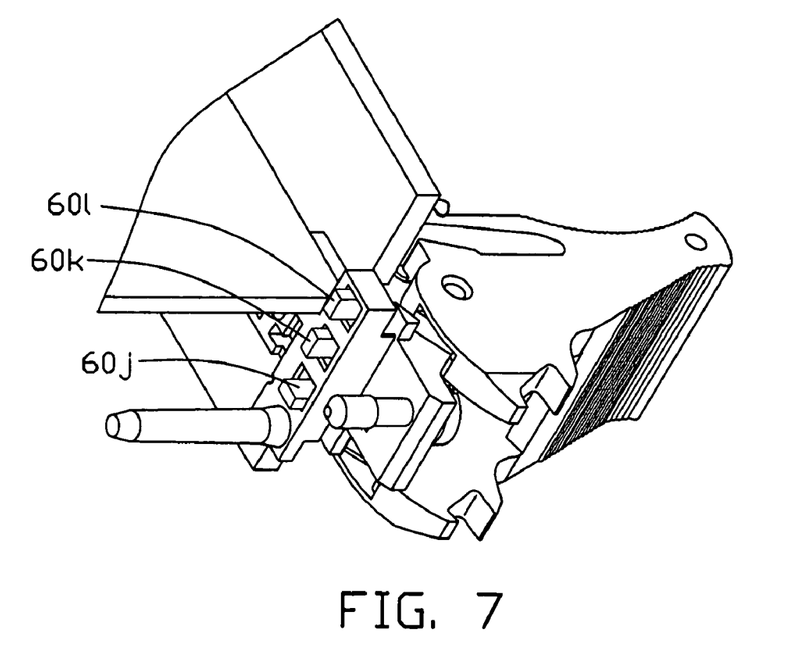
FIG. 7 is an enlarged, isometric view showing a fourth possible combination of code pins of the plug-in unit of FIG. 1.
Figure 8:
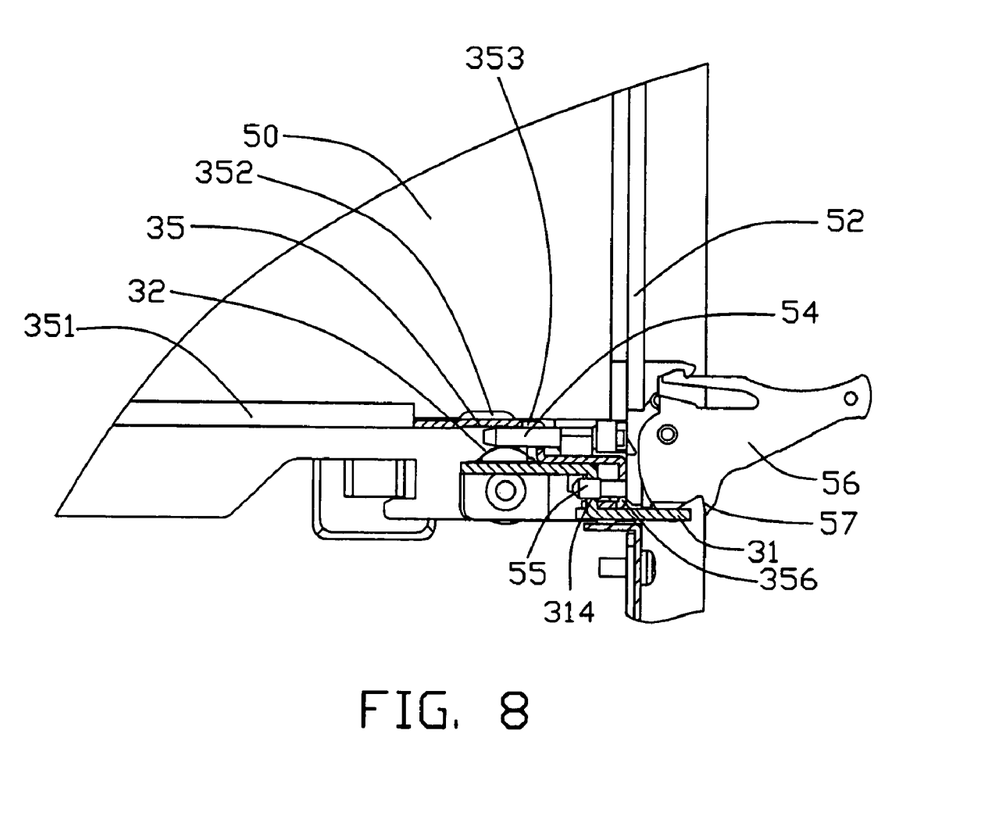
FIG. 8 is a cross-sectional view showing a part of the bottom wall of FIG. 2, and showing the plug-in unit engaged therewith.
Figure 9D:
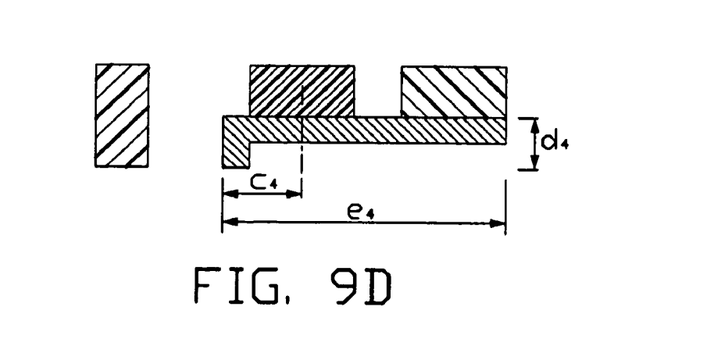
FIG. 9D is a schematic view of a fourth flake of the bottom wall engaging with a corresponding combination of code pins.

In FIG. 7 and FIG. 9D, a code pin combination 60j, 60k, 60l is shown, wherein the code pin 60j is engaged in an upright-left position and each code pin 60k or 60l is engaged in a transverse-down position. The corresponding flake 44 is configured as follows: the height d4 is greater than a/2, the length e4 is greater than 2a and less than 5a/2, and the deviation c4 relative to the slide channel 351 is greater than a/2 and less than a, in order to ensure that the combination of code pins 60j, 60k, 60l can avoid being blocked by the flake 44 and enable the plug-in unit 50 to be inserted into the subrack 1.

Referring to FIG. 2 and FIG. 3 again, the second plate 31 comprises a vertical portion 315, and first and second horizontal portions 316, 310 extending from bottom and top sides of the vertical portion 315 in respective opposite directions. A row of mounting apertures 314 is defined in the vertical portion 315, corresponding to the row of through apertures 356 of the first plate 35. In the exemplary embodiment, the mounting apertures 314 are screw apertures. A plurality of pairs of rectangular openings 318 is defined in a front part of the first horizontal portion 316. Each pair of rectangular openings 318 can engagingly receive the claws 57 of a corresponding one of the handles 56 respectively. A plurality of extensions 311 is formed at a rear side of the second horizontal portion 310, for aligning with the alignment holes 353 and creating corresponding spaces for receiving the gaskets 32. Rivets 33 are extended through rivet holes (not labeled), thereby securely joining the first and second plates 35, 31 together.

Each gasket 32 is adhered to a corresponding one of the extensions 311. Other suitable attachment means such as screw jointing can alternatively be adopted.

Assembly of the plug-in unit 50 into the subrack 1 is as follows. For the sake of simplicity, unless the context indicates otherwise, only the bottom wall 30 and the corresponding handle 56 of the plug-in unit 50 are shown and described hereafter. The plug-in unit 50 is positioned adjacent a corresponding pair of protrusions 352. The plug-in unit 50 is pushed inwardly to slide through the entrance of the protrusions 352 and into the corresponding slide channel 351. When the PCB 51 almost reaches a connector (not shown) located at a rear of the subrack 1, the alignment pin 54 extends into the corresponding alignment hole 353 to guide the PCB 51 to accurately engage with the connector. If the combination of code pins 60 on the mounting panel 52 does not match with the flake 40 on the first plate 355a, the plug-in unit 50 is blocked and cannot be further inserted into the subrack 1. That is, the flake 40 functions as protection against mis-inserting of an incorrect plug-in unit 50 into the slide channel 351. If the combination of code pins 60 on the mounting panel 52 matches the flake 40, the plug-in unit 50 can be completely slid into the subrack 1 and engaged with the connector. Then the handles 56 engage in the corresponding pair of rectangular openings 318 to prevent the plug-in unit 50 from being accidentally withdrawn from the subrack 1. In this state, the gasket 32 resiliently abuts against the alignment pin 54 to form a grounding path between the bottom wall 30 and the plug-in unit 50. Finally, the screw 55 is extended through the corresponding through aperture 356 of the first plate 35 and engaged in the corresponding screw aperture 314 of the second plate 31. The plug-in unit 50 is thus secured in the subrack 1.

To remove the plug-in unit 50 from the subrack 1, the screw 55 is disengaged from the screw aperture 314. The handle 56 is rotated downwardly so that it disengages from the rectangular openings 318. The plug-in unit 50 can then be easily slid out from the subrack 1.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A subrack, comprising: a plurality of plug-in units, each comprising a printed circuit board and a mounting panel attached to an end of the printed circuit board, each of opposite ends of the mounting panel comprising an alignment pin, and a particular combination of code pins; a pair of parallel sidewalls; and a bottom wall and a top wall fixed between the side walls to cooperatively define a receiving space therebetween adapted to accommodate the plug-in units; wherein each of the bottom wall and top wall comprises: a first plate comprising a main portion and a recessed edge portion, the main portion defining a plurality of spaced slide channels for slidably receiving the printed circuit boards therein respectively, and a plurality of alignment holes adjacent corresponding slide channels for receiving the corresponding alignment pins to guide the plug-in units into the receiving space, the recessed edge portion forming a plurality of L-shaped flakes substantially in front of the slide channels respectively; and a second plate engaging with the first plate; wherein any one or more of a height, a length, and a deviation relative to the corresponding slide channel of each of the flakes varies relative to another one of the flakes according to different combinations of corresponding code pins on the corresponding mounting panels, in order that the flakes respectively match the combinations of the corresponding code pins on the corresponding mounting panels and thereby prevent improper insertion of the corresponding plug-in units into the subrack.

2. The subrack as described in claim 1, wherein the top wall is substantially a mirror image of the bottom wall.

3. The subrack as described in claim 1, wherein each of the plug-in units further comprises a mounting pin extending from each of opposite ends thereof, the second plate comprises a vertical portion defining a plurality of mounting apertures therein, and the corresponding mounting pins of the plug-in units are engagingly received in the mounting apertures.

4. The subrack as described in claim 3, wherein the second plate further comprises at least one horizontal portion extending from a side of the vertical portion, the at least one horizontal portion being attached to the recessed edge portion thereby fixing the first and second plates together.

5. The subrack as described in claim 4, wherein the recessed edge portion of the first plate sequentially comprises a first bent plate, a second bent plate, and a third bent plats plate integrally joined together at respective perpendicularly bent junctions therebetween, the first bent plate connecting with an end portion of the second bent plate, and the third bent plate connecting with an opposite end portion of the second bent plate.

6. The subrack as described in claim 5, wherein the second bent plate of the recessed edge portion of the first plate defines a row of through apertures opposite to the corresponding mounting apertures of the vertical portion of the second plate, for receiving portions of the corresponding mounting pins therethrough.

7. The subrack as described in claim 4, wherein each of the bottom wall and the top wall further comprises a plurality of gaskets resiliently abutting against the corresponding alignment pins to form a plurality of grounding paths.

8. The subrack as described in claim 7, wherein a horizontal portion of the second plate comprises a plurality of extensions corresponding to the alignment holes of the main portion of the first plate, and the corresponding gaskets are mounted between the extensions and the alignment holes, in order that the corresponding gaskets can resiliently abut against the alignment pins after the plug-in units are fully received in the subrack.

9. The subrack as described in claim 8, wherein the corresponding gaskets are adhered to the extensions.

10. The subrack as described in claim 7, wherein each of the mounting panels further comprises a pair of handles at the opposite ends thereof, each handle forms a claw, and a horizontal portion of the second plate of each of the bottom wall and top wall defines a row of openings, and when the corresponding plug-in unit is fully received in the subrack, the claws are engaged in two corresponding openings such that the plug-in unit is secured in the subrack.

11. A subrack assembly, comprising: a plurality of plug-in units, each of the plug-in units having a combination of closely arranged code pins, each of the code pins essentially positioned at a confined area while selectively located, within the confined area, at a particular one of a plurality of possible positions in an imaginary vertical plane perpendicular to a front-to-back direction; a pair of sidewalls; a bottom wall and a top wall fixed between the side walls, with a plurality of receiving sections formed between the top wall and the bottom wall, the receiving sections arranged side by side with one another and extending along the front-to-back direction each for receiving a corresponding plug-in unit; wherein each of the receiving sections comprises: a pair of spaced slide channels respectively formed on the top wall and the bottom wall, used for slidably receiving a corresponding one of the plug-in units; a pair of alignment holes adjacent the slide channels respectively, for guiding the corresponding plug-in unit into the receiving section; and at least one constraint device, each of the at least one constraint device formed substantially in front of a respective one of the slide channels and extending in a specific configuration so as to not only comply with at least two corresponding code pins when the corresponding plug-in unit is received in the receiving section but also block at least one incompliant code pin of an incorrect plug-in unit for preventing misinsertion of the incorrect plug-in unit into the receiving section; wherein the at least one constraint device essentially extends along a lateral direction perpendicular to the front-to-back direction; wherein the least one constraint device is stamped out from a metal plate; wherein the least one constraint device is at least two constraint devices, and at least two of the at least two constraint devices have different lengths along a lateral direction perpendicular to 4 the front-to-back direction, and different heights along a vertical direction perpendicular to both said the front-to-back direction and the lateral direction; wherein the at least one constraint device is only a single constraint device.

12. The subrack assembly as claimed in claim 11, wherein the at least one constraint device is an L-shaped flake.

* * * * *